United States Patent
Chung (10) Patent No.: US 7,221,199 B2
(45) Date of Patent: May 22, 2007

(54) CIRCUIT AND METHOD FOR GENERATING LEVEL-TRIGGERED POWER UP RESET SIGNAL

(75) Inventor: Shine Chien Chung, Sanchung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 92 days.

(21) Appl. No.: 10/994,567

(22) Filed: Nov. 22, 2004

(65) Prior Publication Data

US 2005/0174154 A1    Aug. 11, 2005

Related U.S. Application Data

(60) Provisional application No. 60/532,430, filed on Dec. 24, 2003.

(51) Int. Cl.
*H03K 17/22*    (2006.01)
*H03L 7/00*    (2006.01)

(52) U.S. Cl. .................. 327/143; 327/198; 323/901

(58) Field of Classification Search ................ 327/143, 327/198; 323/901
See application file for complete search history.

(56) References Cited

U.S. PATENT DOCUMENTS

| | | | | |
|---|---|---|---|---|
| 5,151,614 | A * | 9/1992 | Yamazaki et al. | 327/143 |
| 5,321,317 | A * | 6/1994 | Pascucci et al. | 327/143 |
| 5,703,510 | A * | 12/1997 | Iketani et al. | 327/143 |
| 6,711,062 | B1 * | 3/2004 | Chou | 365/185.2 |

* cited by examiner

*Primary Examiner*—My-Trang Nuton
*Assistant Examiner*—Terry L. Englund
(74) *Attorney, Agent, or Firm*—Duane Morris LLP (57) ABSTRACT

A power supply voltage follower connected to a power supply is used for proportionally following an increase of a supply voltage to output a power up reset signal. A pulse generation control circuit coupled to the power supply voltage follower is used for discharging the power supply voltage follower when the supply voltage exceeds a predefined threshold voltage, thereby causing the power up reset signal to produce a reset pulse.

16 Claims, 5 Drawing Sheets

CIRCUIT AND METHOD FOR GENERATING LEVEL-TRIGGERED POWER UP RESET SIGNAL

CROSS REFERENCE

The present application claims the benefits of U.S. Provisional Application Ser. No. 60/532,430, which was filed on Dec. 24, 2003 entitled "Level-Triggered Power-On-Reset Circuit.

BACKGROUND

The present invention relates generally to a power up reset (PUR) circuit that generates a reset pulse during a power up operation to reset components, such as flip-flops, latches and registers, in an integrated circuit (IC).

A PUR circuit can bring an IC into a well-defined state before normal operation. The power up reset sequence brings the IC to this state by resetting the system components with pulses generated by the circuit, such that the device will function properly.

Conventional PUR circuit designs are based on a time-triggered system controlled by the charging and discharging time of capacitors. While the system can provide the pulse needed, the circuit may fail when the RC time constants are much faster than the ramp-up time of the supply voltage. Unlike devices with higher supply voltage, the ramp-up rate for a low voltage circuit is slow, and conventional PUR circuit designs often encounter problems when dealing with such slow ramp-up rate. The ramp-up rate of supply voltage in low power circuits can be 1 ms to 10 ms or even slower. As technology continues to improve and low voltage processes are becoming more common, solutions to such a problem are needed. In order for a conventional PUR circuit to function properly at such a slow ramp-up rate, large capacitors or other MOS devices may need to be implemented to increase RC time constants. However, such components will enlarge the circuit, thereby making the circuit impractical.

An ideal PUR circuit should provide a consistent pulse generation at any ramp-up rate, while consuming zero DC current. The ideal PUR circuit should also occupy a small area for practical purposes.

It is desirable in the art of power up reset circuits to have new designs that are not based on triggering by the charging and discharging time of capacitors and reduced in circuit area.

SUMMARY

In view of the foregoing, this disclosure provides power up reset (PUR) circuits to reset components such as flip-flops, latches, or registers in an IC, and methods to bring the said components into well-defined state during power up before the normal operation.

The power up reset circuit includes a power supply voltage follower that is connected to a power supply for proportionally following an increase of a supply voltage to output a power up reset signal. A pulse generation control circuit coupled to the power supply voltage follower is used for discharging the power supply voltage follower when the supply voltage exceeds a predefined threshold voltage, thereby causing the power up reset signal to produce a reset pulse.

The construction and method of operation for this invention, however, together with additional objects and advantages thereof, will be best understood from the following descriptions of specific embodiments, when read in connection with the accompanying figures.

DESCRIPTION

The present disclosure provides a power up reset (PUR) circuit and its method for generating a pulse to reset components, such as flip-flops, latches, and registers, in a chip during a power up operation.

Figure 1A:
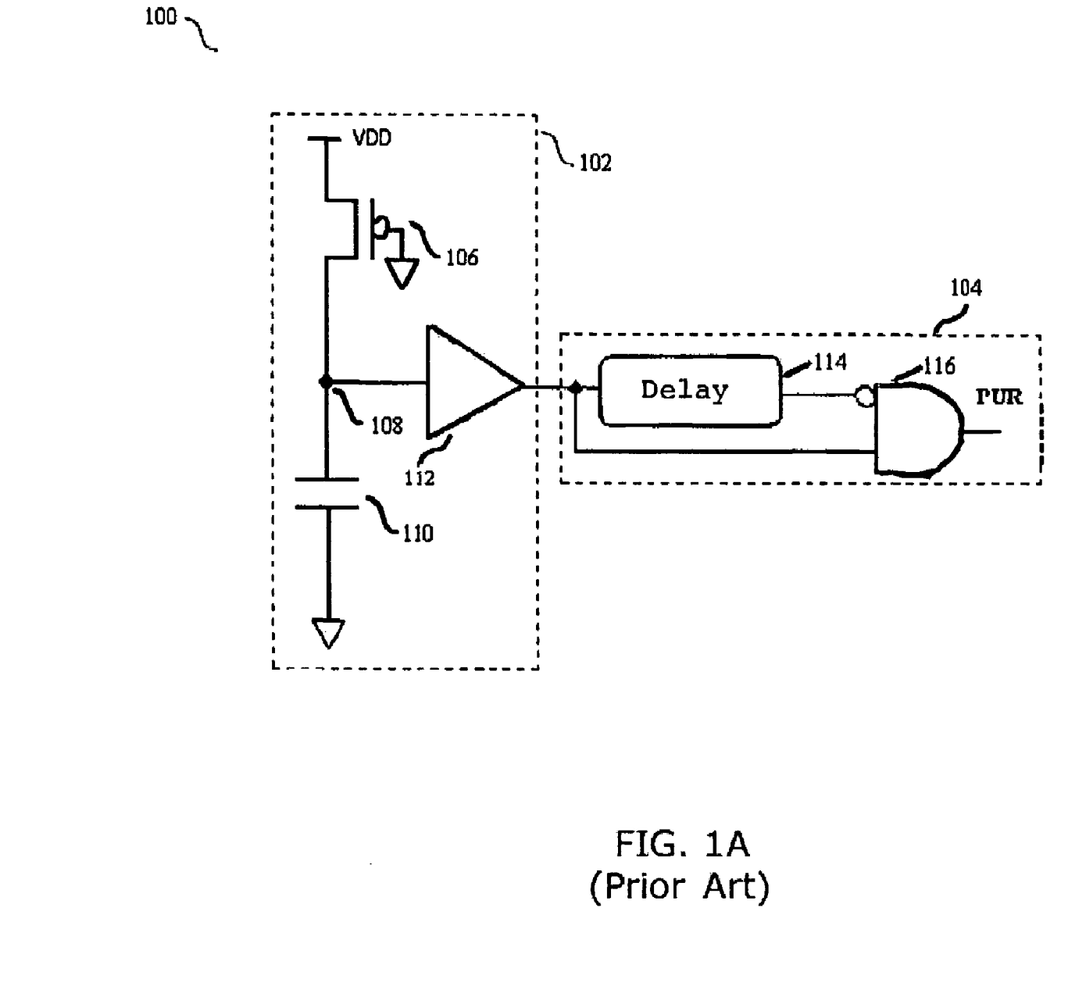
FIG. 1A illustrates a conventional PUR circuit using a time-triggered system to generate a reset pulse.

FIG. 1 presents a conventional power up reset (PUR) circuit 100 in the semiconductor industry. The PUR circuit is used for almost all application-specific integrated circuits (ASIC), microprocessor, or even memory to bring a chip into a well-defined state at the beginning of normal operation. This time-triggered PUR circuit 100 is mainly separated into two blocks: a pulse delay block 102 and a pulse generation block 104. At the beginning of an operation, all nodes are at ground voltage when supply voltage begins to ramp up. When a supply voltage is applied, the pulse delay block 102 delays the starting of a pulse until the output of charging circuit, consisting of 106 and 110 reaches, to a trip point of buffer 112. As the supply voltage, or VDD, ramps up, a PMOS transistor 106 will turn on, thereby allowing voltage to charge through the transistor 106 to a node 108. A capacitor 110 will slowly charge up the node 108 to provide a voltage at the node 108 high enough to turn on the buffer 112. As VDD continues to ramp up, the higher signal of the node 108 then goes through the buffer 112 before going into the pulse generation block 104. The pulse generation block 104 consists of a delay block 114 and an AND gate 116 with one complement input, as one embodiment. The delay block 114 can be of different kinds of delay such as a string of inverter chain with large capacitors at each output. As an example, a common choice in such circumstance could include Schmidt triggers since it can also provide hysteresis for better noise immunity. The common methods used to generate a pulse are to delay and invert the signal and gate it with the original signal using an AND gate. The output from the pulse generation block 104 is the PUR signal.

Figure 1B:
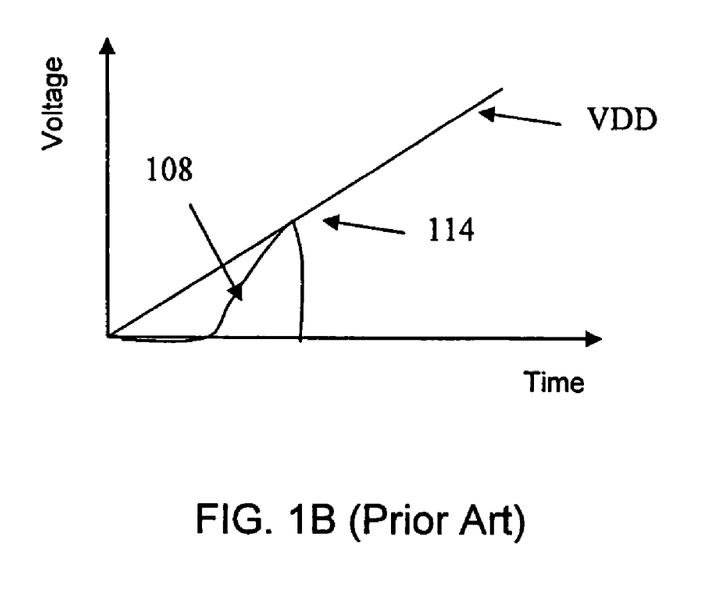
FIG. 1B shows timing waveforms of the conventional PUR circuit.

The time-triggered PUR circuit 100 may not function correctly in some conditions, such as leakage current produced by very deep submicron devices, or the ramp-up rate of supply voltage is much slower. This time-triggered PUR circuit cannot generate pulses if the ramp-up rate of supply voltage is much slower than the RC time constant of the charging circuit. For the PUR circuit 100, RC timing constants are used in either the pulse delay block 102 or the pulse generation block 104 for proper timing. FIG. 1B shows the waveforms at nodes 108 and 114 following the supply voltage with delays. The pulse width of the PUR depends on timing delay between 108 and 114. If the time constants of blocks 102 or 104 is much smaller than the supply voltage ramp rate, the signals at nodes 108 or 114 just follow the supply voltage immediately and generate no pulse. In order to guarantee that the PUR circuit 100 can generate a pulse for all practical ramp rates, the capacitor, or MOS devices for RC time constants used, could be impractically large for certain semiconductor designs.

Figure 2:
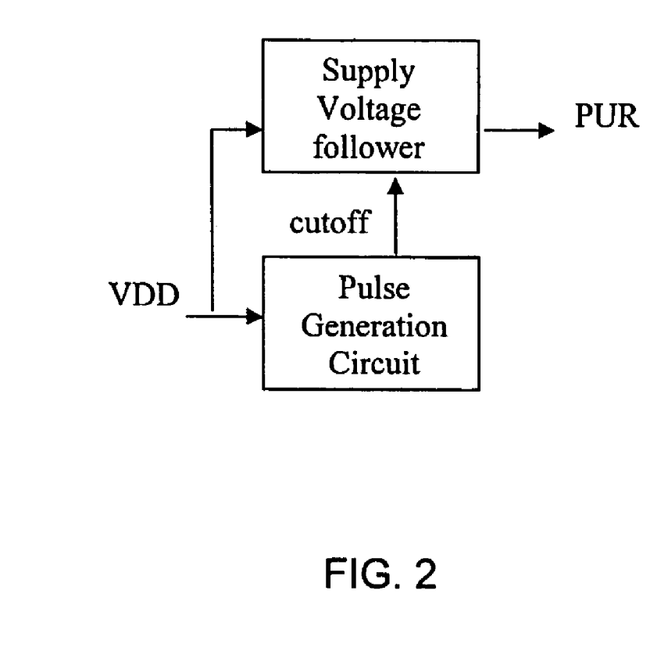
FIG. 2 shows a block diagram of level-triggering PUR circuit.

FIG. 2 illustrates a concept of level-triggering PUR, in accordance with one embodiment of the present invention. The disclosed PRU circuit and its method are based on a level-triggered, rather than timing triggered, scheme. At the beginning, the progression of the PUR signal closely follows the ramping-up of the supply voltage VDD. When the voltage level of the PUR signal reaches a predetermined threshold value, the PUR signal will be cut off from following the VDD ramping, and a voltage pulse is, therefore, created. The level-triggered concept eliminates the need of a RC time constant circuit that is sensitive to the VDD ramping rate. Various implementations of the level-triggered scheme are described in the followings paragraphs.

Figure 3A:
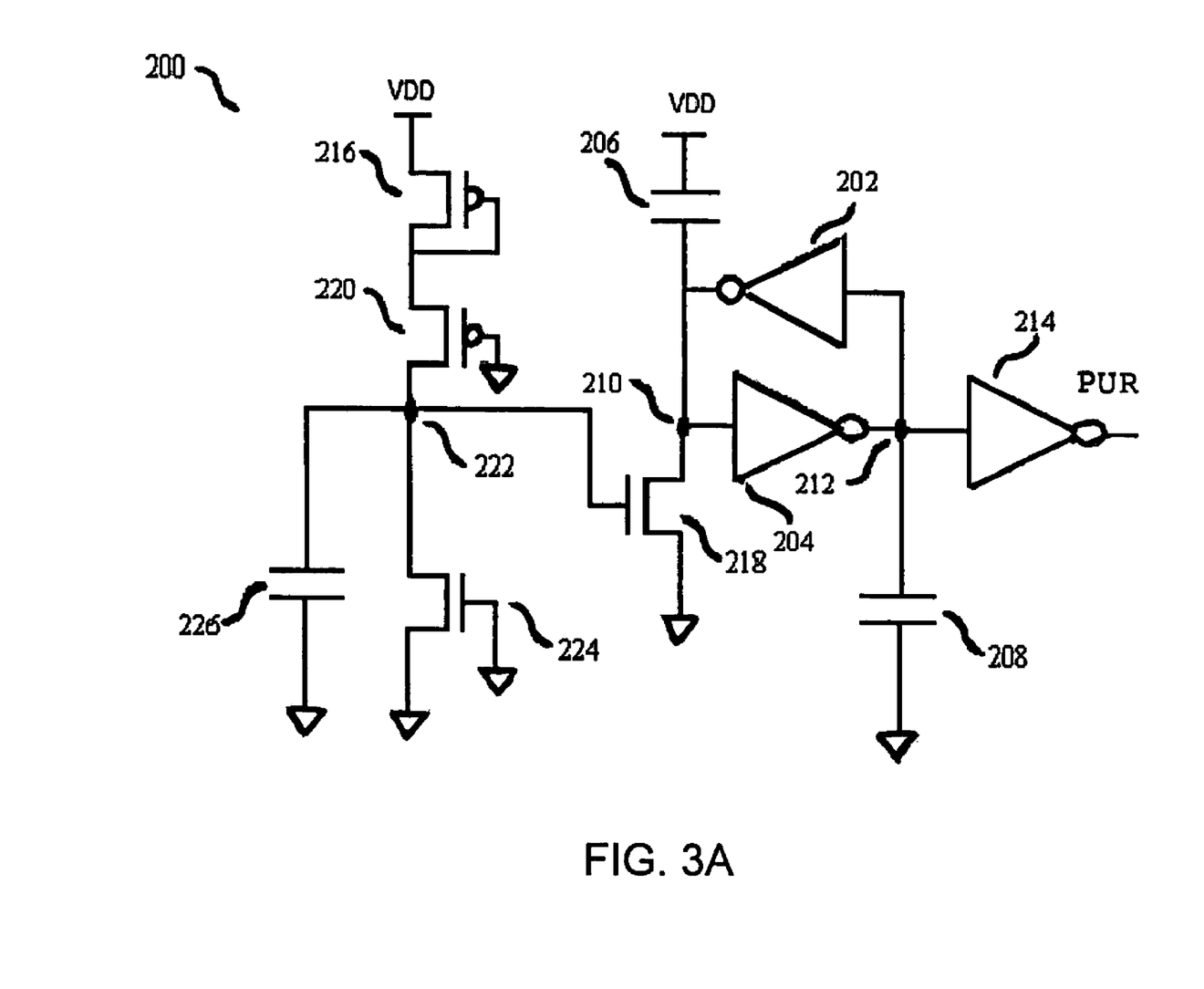
FIG. 3A illustrates a PUR circuit using a level-triggered design, in accordance with one embodiment of the present invention.

FIG. 3A illustrates a PUR circuit 200 in accordance with a first embodiment of the present invention. The PUR circuit 200 is based on a level-triggered design rather than a time-triggered design. This level-triggered PUR circuit does not depend on RC time constants for pulse delay or pulse generation. The PUR signal follows supply voltage VDD ramping and generates a reset pulse when it reaches a predefined threshold voltage.

The PUR circuit 200 includes, but not limited to, a power supply voltage follower connected to a power supply, and a pulse generation control circuit coupled to the same. The power supply voltage follower is collectively represented by inverters 202 and 204, and capacitors 206 and 208. The pulse generation control circuit is collectively represented by MOS transistors 216, 218 and 220.

The cross-coupled inverters 202 and 204 constitute a latch to hold data statically. The output lead of the inverter 202 is connected to the input lead of the inverter 204 via a node 210. The output lead of the inverter 204 is connected to the input lead of the inverter 202 via a node 212. The output lead of the inverter 204 is further connected to the input lead of an inverter 214, which outputs the PUR signal. The capacitor 206 is coupled between a power supply and the node 210. The capacitor 208 is connected between the node 212 and ground. The capacitors 206 and 208 are coupled to VDD and GND, respectively, to ensure that nodes 210 and 212 are preset to logic "1" and "0," respectively, during power up.

The devices 216, 220, 224, and 226 constitute a level detection circuit. The PMOS transistor 216 is coupled between the power supply and the PMOS transistor 220, with its gate connected to its drain. The PMOS transistor 220 has a grounded gate and a drain connected to a gate of the NMOS transistor 218 via a node 222. The NMOS transistor 218 is connected between the node 210 and ground. A capacitor 226 and NMOS transistor 224 are coupled between the node 222 and ground.

With the implementation of the PUR circuit 200, two inverters 202 and 204 work with two capacitors 206 and 208 to function as a preset latch. The nodes 210 and 212 are coupled high and low through the capacitors 206 and 208, respectively, when the supply voltage VDD begins to ramp up. The capacitances of the capacitors 206 and 208 need to be at least ten times larger than the gate and junction capacitances at nodes 210 and 212 in order to ensure proper coupling. The PUR signal proportionally follows an increase of VDD through the inverter 214. The preset latch provides feedback to hold nodes 210 and 212 steady, since some floating nodes could discharge node 210 prematurely during power up.

The PUR signal would continue to rise until VDD exceeds the threshold voltage predefined by the PMOS transistor 216, NMOS transistor 218 and PMOS transistor 220. The threshold voltage would equal to the summation of individual threshold voltages of the PMOS transistors 216 and NMOS 218 plus an additional voltage drop across the PMOS transistor 220. This will then allow a node 222 to have a voltage level that meets the design margin, thereby turning on the transistor 218 and further pulling the node 210 low to ground. This will activate the flipping of the state of the preset latch to low. The PUR signal at the output of the inverter 214 will go low subsequently and produce a reset pulse. Since node 210 discharges to ground when VDD is higher than the predefined threshold voltage of the transistors 216 and 218, the state change of the circuit is voltage-level driven rather than time driven for the conventional PUR circuits. This would reduce the size of the PUR circuit for no large capacitor is needed, as so in the prior art. The NMOS transistor 224, with gate grounded, provides small leakage current to determine the threshold voltage of the PMOS transistor 216 that is connected as a diode. The capacitor 226, not a part of RC circuit, can be small enough to filter noises or glitches for proper operation.

To ensure proper design margins, the capacitors 206 and 208 are preferably made of metal fringe capacitors or zero threshold voltage MOS devices such that the sufficient capacitance can be guaranteed even when VDD is very low. To increase the VDD threshold, the transistors 216 and 218 should be high threshold voltage devices. The high threshold voltage devices can be either high-Vt devices or standard Vt devices with narrow widths or long channels to increase turn-on threshold. An NMOS transistor 224 provides a leakage path to keep the node 222 at least one PMOS diode drop below VDD. A small capacitor 226 acts as a noise filter for VDD glitches.

Figure 3B:
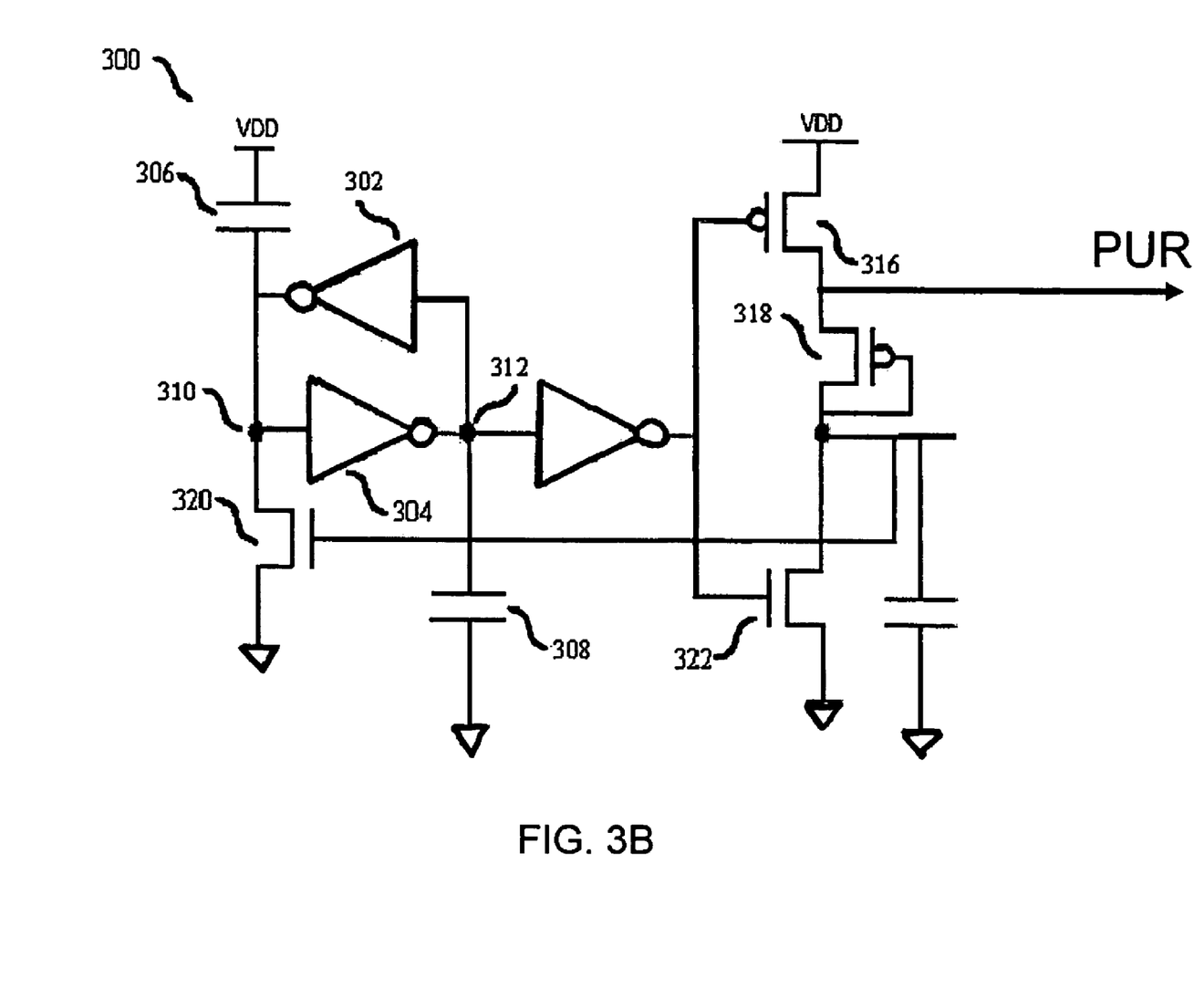
FIG. 3B illustrates a PUR circuit using a level-triggered design, in accordance with another embodiment of the present invention.

FIG. 3B illustrates a PUR circuit 300 in accordance with the second embodiment of the present invention. The PUR circuit 300 includes, but not limited to, a power supply voltage follower connected to a power supply, and a pulse generation control circuit coupled to the same. The power supply voltage follower is collectively represented by inverters 302 and 304, and capacitors 306 and 308. The pulse generation control circuit is collectively represented by MOS transistors 316, 318 and 320.

The output lead of the inverter 302 is connected to the input lead of the inverter 304 via a node 310. The output lead of the inverter 304 is connected to the input lead of the inverter 302 via a node 312. The capacitor 306 is coupled between a power supply and the node 310. The capacitor 308 is connected between the node 312 and ground. The node 312 is further connected to the pulse generation control signal, which outputs the PUR signal following the supply voltage ramping-up, via an inverter.

The PMOS transistor 316 is coupled between the power supply and the PMOS transistor 318, whose gate is connected to its drain. The PMOS transistor 318 is further connected to the gate of the NMOS transistor 320 and the drain of the NMOS transistor 322.

Initially, all nodes in the PUR circuit 300 are at ground voltage before VDD ramps up to operate the circuit. Two inverters 302 and 304 work with two capacitors 306 and 308 to function as a preset latch. Nodes 310 and 312 are coupled to VDD and ground through capacitors 306 and 308, respectively, when VDD is ramping up. As VDD continues to ramp up, the power supply voltage follower, represented by the inverters 302, 304 and the capacitors 306, 308, outputs a pull-up control signal to control the PMOS transistor 316 and the NMOS transistor 322. As a result, the PUR signal is pulled up by PMOS transistor 316, proportionally following the VDD ramping-up. The NMOS transistor 320 is off until VDD reaches higher than the combined voltage drop of the transistors 316 and 318, to turn on the NMOS transistor 320, which is a threshold voltage of PMOS device 318, a threshold voltage of NMOS device 320 and a small voltage drop on 316. When the node 310 is pulled low, the PUR signal will produce a reset pulse.

In order for the circuit 300 to function properly, the capacitances of the capacitors 306 and 308 need to be at least 10 times larger than the gate and junction capacitances at the nodes 310 and 312 such that the two nodes can follow VDD and stay ground. The capacitors 306 and 308 are preferably made of zero threshold voltage MOS devices or metal fringe capacitors to ensure proper functionality. The transistors 318 and 320 should also be high threshold voltage devices in order to increase design margin.

Figure 4:
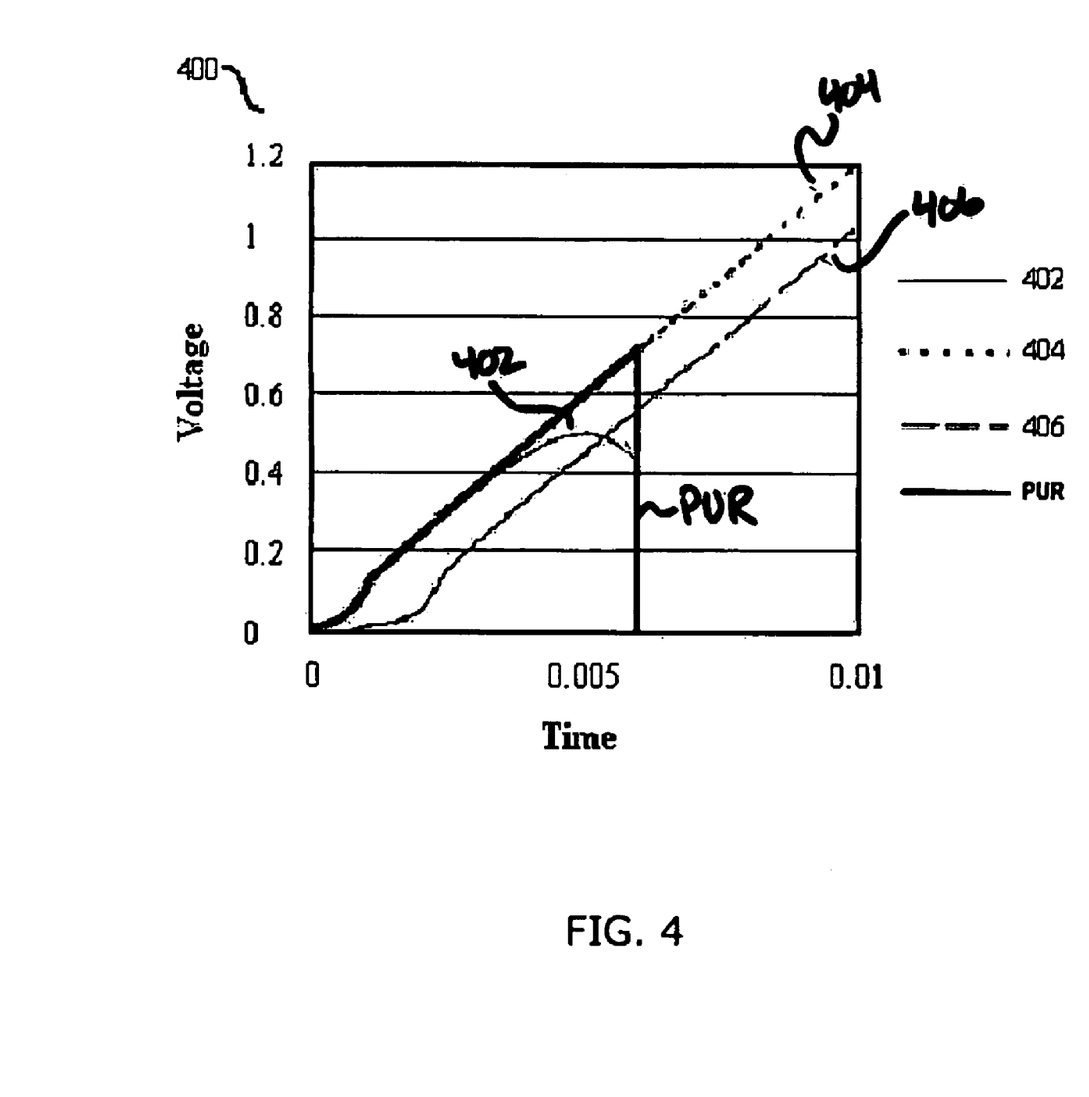
FIG. 4 shows the relationship between voltage and time from simulation results of signals, in accordance with the embodiment as illustrated in FIG. 3A.

FIG. 4 presents a graph 400 showing the relationship between voltage and time from a simulation in accordance with the first example of the present disclosure. Four signals are traced in the waveforms of the graph 400. With references to FIGS. 2 and 4, a curve 402 represents the signal at the node 210; a curve 404 represents the VDD; a curve 406 represents the signal at the node 222; and a curve PUR represents the PUR signal at the output of the inverter 214. When the PUR circuit 200 begins to operate by ramping up source voltage VDD, the signal 402 at the node 210 follows VDD high. In this example, the curve 406 for the node 222 is always one PMOS diode drop, which is about 0.3 volts below VDD. The PUR signal at the output of the inverter 214 remains high with the VDD level until the signal 406 reaches 0.55 volts, which is the threshold voltage of the transistor 218 in FIG. 3A. The PUR signal follows VDD until it reaches 0.7 volts and then drops low. 0.7 volts is the sum of $V_{tn}$ and $|V_{tp}|$ that is sufficient to reset the latches or flip-flops considering that most MOS circuits start to work when VDD is slightly higher than $V_{tn}$. The PUR reset level can also be designed higher than 0.7 volts by using a higher threshold voltage device or stacked MOS diodes in the transistor 218.

In the above disclosure, two low voltage PUR circuits are presented. The two circuits use an improved PUR scheme based on voltage level triggering rather than time-triggered method, which is commonly used in conventional PUR circuits. The voltage level-triggered circuits provide PUR functions even at very low ramp-up rate and low voltage level by having the PUR signal follow the supply voltage through a latch until the supply voltage exceeds the threshold, thereby resetting the latch and PUR signal to ground. With such a method, PUR functions are provided for any ramp-up rate without using large components, such as large capacitors, typically required in conventional PUR circuits, thereby significantly reducing cost of production.

The above disclosure provides many different embodiments or examples for implementing different features of the disclosure. Specific examples of components and processes regarding power up reset circuits are described to help clarify the disclosure. These are, of course, merely examples and are not intended to limit the disclosure from that described in the claims.

Although illustrative embodiments of example PUR circuit designs for this disclosure have been shown and described, other modifications, changes and substitutions are intended in the foregoing disclosure. Accordingly, it is appropriate that the appended claims be construed broadly and in a manner consistent with the scope of the disclosure, as set forth in the following claims.

What is claimed is:

1. A power up reset circuit comprising:
   a power supply voltage follower connected to a power supply for proportionally following an increase of a supply voltage to output a pull-up control signal; and
   a pulse generation control circuit coupled to an output node of the power supply voltage follower and the power supply for outputting a power up reset signal in response to the pull-up control signal, when the supply voltage begins ramping up, the pulse generation control circuit comprising:
   a first MOS transistor comprising a first gate, a first node and a second node, the first node being coupled to ground;
   a second MOS transistor comprising a second gate, a third node and a fourth node, the third node of the second MOS transistor being coupled to the first gate of the first MOS transistor; and
   a third MOS transistor comprising a third gate, a fifth node and a sixth node, the third gate being coupled to the output node of the power supply voltage follower, the fifth node being coupled to the fourth node, the sixth node being coupled to the power supply,
   wherein the pulse generation control circuit switches a voltage level at the output node, when the supply voltage exceeds a predefined threshold voltage, thereby causing the power up reset signal to produce a reset pulse.

2. The power up reset circuit of claim 1 wherein the second node of the first MOS transistor is coupled to the power supply voltage follower, wherein when the supply voltage exceeds the predefined threshold voltage, the first MOS transistor is turned on to switch the voltage level at the output node of the power supply voltage follower.

3. The power up reset circuit of claim 1 wherein the predefined threshold voltage is no less than a summation of a first threshold voltage of the first MOS transistor and a second threshold voltage of the second MOS transistor.

4. The power up reset circuit of claim 1 wherein the second MOS transistor is a PMOS transistor, and the second gate is coupled to the third node.

5. The power up reset circuit of claim 4 wherein the first MOS transistor and the second MOS transistor are high voltage threshold devices for increasing a design margin of the predefined threshold voltage.

6. The power up reset circuit of claim 3 wherein the third MOS transistor is coupled between the second MOS transistor and the power supply for raising the predefined threshold voltage by a voltage drop value across the third MOS transistor.

7. The power up reset circuit of claim 1 wherein the power supply voltage follower comprises a first inverter and a second inverter, wherein a first output lead of the first inverter is connected to a second input lead of the second inverter at a seventh node, and a second output lead of the second inverter is connected to a first input lead of the first inverter at an eighth node.

8. The power up reset circuit of claim 7 wherein the power supply voltage follower further comprises a first capacitor connected between the power supply and the seventh node for coupling the supply voltage to the seventh node.

9. The power up reset circuit of claim 8 wherein the power supply voltage follower further comprises a second capacitor connected between the eighth node and ground for coupling a ground voltage to the eighth node.

10. The power up reset circuit of claim 7 further comprising a third inverter connected to the eighth node for inverting signals output from the second inverter to produce the pull-up control signal.

11. The power up reset circuit of claim 1 further comprising a fourth MOS transistor, the fourth MOS transistor comprising a fourth gate, a seventh node and an eighth node, wherein the fourth gate is coupled to the output node of the power supply voltage follower, the seventh node is coupled to ground and the eighth node is coupled to the third node.

12. The power up reset circuit of claim 1 further comprising a capacitor coupled between the third node and ground for serving as a noise filter.

13. A method for generating a power up reset signal with a level-triggered power up reset circuit, which comprises a power supply voltage follower for proportionally following an increase of a supply voltage to from a power supply output the power up reset signal, and a pulse generation control circuit coupled to an output node of the power supply voltage follower for causing the power up reset signal to produce a reset pulse when the supply voltage exceeds a predefined threshold voltage, wherein the pulse generation control circuit comprises: a first MOS transistor comprising a first gate, a first node and a second node, the first node being coupled to ground; a second MOS transistor comprising a second gate, a third node and a fourth node, the third node of the second MOS transistor being coupled to the first gate of the first MOS transistor; and a third MOS transistor comprising a third gate, a fifth node and a sixth node, the third gate being coupled to the output node of the power supply voltage follower, the fifth node being coupled to the fourth node, the sixth node being coupled to the power supply, the method comprising:

initiating a power supply ramping-up operation;

outputting the power up reset signal proportionally following an increase of the supply voltage by the power supply;

detecting when the supply voltage reaches the predefined threshold of no less than a summation of a first threshold voltage of the first MOS transistor, a second threshold voltage of the second MOS transistor and a third threshold voltage of the third MOS transistor; and producing the reset pulse from the power up reset signal.

14. The method of claim 13 wherein the producing step comprises switching a voltage level at the output node of the power supply voltage follower.

15. The method of claim 13 further comprising holding the power supply voltage follower in a steady state after the initiating of the ramping-up operation.

16. The method of claim 13 further comprising resetting the power supply voltage follower, when the supply voltage reaches the summation of the first threshold voltage of the first MOS transistor, the second threshold voltage of the second MOS transistor and the third threshold voltage of the third MOS transistor.

* * * * *

UNITED STATES PATENT AND TRADEMARK OFFICE
CERTIFICATE OF CORRECTION

| | |
|---|---|
| PATENT NO. | : 7,221,199 B2 |
| APPLICATION NO. | : 10/994567 |
| DATED | : May 22, 2007 |
| INVENTOR(S) | : Shine Chien Chung |

Page 1 of 1

It is certified that error appears in the above-identified patent and that said Letters Patent is hereby corrected as shown below:

Column 3, line 14, delete "PRU" and insert therefore -- PUR--.

Column 5, line 14, before "316", insert -- the PMOS transistor --.

Column 5, line 20, delete "ground" and insert therefore -- at ground, respectively --.

Column 5, line 29, delete "2" and insert therefore -- 3A --.

Column 5, line 38, delete "high".

Column 7, line 23, delete "to".

Column 7, line 24, before "output" insert -- to --.

Signed and Sealed this

Sixteenth Day of October, 2007

JON W. DUDAS
*Director of the United States Patent and Trademark Office*